United States Patent [19]

Boris et al.

[11] Patent Number: 4,989,175
[45] Date of Patent: Jan. 29, 1991

[54] HIGH SPEED ON-CHIP CLOCK PHASE GENERATING SYSTEM

[75] Inventors: Leonard D. Boris, King of Prussia; David E. Chodelka, North Wales, both of Pa.

[73] Assignee: Unisys Corp., Blue Bell, Pa.

[21] Appl. No.: 276,163

[22] Filed: Nov. 25, 1988

[51] Int. Cl.⁵ .................................................. G06F 1/12
[52] U.S. Cl. .................................. 364/900; 364/950.3; 364/934; 364/933.3
[58] Field of Search .............................. 364/200, 900

[56] References Cited

U.S. PATENT DOCUMENTS

| | | | |
|---|---|---|---|
| 3,355,715 | 11/1967 | Harris | 364/900 |
| 4,034,352 | 7/1977 | Hotchkiss | 364/900 |
| 4,398,085 | 8/1983 | Benedict | 364/900 X |

Primary Examiner—Thomas M. Heckler
Attorney, Agent, or Firm—John B. Sowell; Mark T. Starr; Thomas J. Scott

[57] ABSTRACT

A plurality of synchronized phase generators are provided in a mainframe computer of the type having unit card each of which contain a plurality of very large scale integrated (VLSI) logic chips. Each logic chip has its own on-chip phase generator which is controlled by off-chip control signals. The on-chip phase generations each comprise output phase control gates coupled to: an on-chip start shift register, a stop shift register, clock shift registers which provide the phase of the clock, and start-stop run controls all of which are coupled to off-chip control signals and to the output phase control gates which are synchronized to eliminate distortion and skew between phase generators on different logic chips.

19 Claims, 8 Drawing Sheets

HIGH SPEED ON-CHIP CLOCK PHASE GENERATING SYSTEM

BACKGROUND OF THE INVENTION

1. Field of the Invention

This invention relates to clock circuits employed to synchronize operations in high speed mainframe computers. More particularly, the present invention relates to on-chip phase clock generators that are synchronized and phase controlled by an off-chip master clock control to provide a synchronized processor system having replaceable synchronized unit cards.

2. Description of the Prior Art

It is well known that mainframe central processing units (CPU's) have been designed to be flexibly expanded and to operate in a distributed processing manner so that the system requires a master clock to coordinate phase synchronization of the different elements of the processor. Heretofore, one or more master clocks have been provided in different CPU's and/or different cabinets of a mainframe CPU. The clock rate and cycle rate of high speed mainframe computers has become so fast that the cable and path delays exceed the time duration of the clock pulses If the mainframe CPU requires high power clock drivers, it has been suggested that individual drivers be provided at each CPU or cabinet and that the input signals to the drivers be synchronized to a master clock located at one of the CPU's or cabinets.

Prior art mainframe computers have employed slave clock systems controlled by master clock systems. When the slave and master clock systems each employ cascading flip-flops to generate clock phases it has been possible to generate phase clock signals having separation or overlap due to process variation in the manufacture of the semi-conductors used for the flip-flops.

This latter problem has been recognized and solved by providing multi-phase output generators and clock systems at each CPU which are synchronized by cascading sync output signals. In this type system a master oscillator is provided to synchronize the multi-phase clock generators at the clock systems of the individual CPU's Such a system is shown and described in copending Application Ser. No. 233,396 entitled A Multiple Frequency Clock System, filed 18 Aug. 1988 and assigned to the assignee of the present invention.

While this latter type clock systems solves most of the clock problems of the prior art high speed main frame computers, the clocks are external to the high speed logic of the CPU and the clock signals supplied to the CPU are subject to delays and skew after leaving the output lines of the clock generator which cannot be further adjusted without making custom adjustment in the output lines of the clock generator.

It would be extremely desirable to provide a simplified clock system which does not require custom adjustment at the phase clock generator level and would permit interchangeability of unit cards in a CPU without clock adjustment or custom synchronization. Further, it would be desirable that the unit cards of the CPU be presynchronized at the factory production level to eliminate overlap, separation, skew and differential delay of clock pulses down to the on-chip logic level.

SUMMARY OF THE INVENTION

It is the principal object of the present invention to provide a novel clock system for a processing system that has a synchronized clock circuit on each logic chip in the processing system.

It is another principal object of the present invention to provide a master clock control circuit for starting, stopping and running on-chip clock phase generators.

It is another principal object of the present invention to provide a master clock controlled circuit for stopping and starting any on-chip clock phase generator at pre-determined clock phase times.

It is another principal object of the present invention to provide a processing system employing a plurality of clock phase generators that do not require field adjustment.

It is another principal object of the present invention to provide a clock phase generating system that requires a minimum number of factory adjustments.

It is another principal object of the present invention to provide a clock system for a processing system that compensates for skew at each logic level down to the on-chip clock generator level.

It is another general object of the present invention to provide on-chip clock generators having interface adaptor circuits for receiving off-chip control signals.

It is another general object of the present invention to provide off-chip control signals to on-chip clock generators that may be stepped or sequenced for test purposes.

It is another general object of the present invention to operate pre-determined on-chip clock generators of a clock generation system in a synchronized step mode or in a synchronized burst mode while operating the processing system in real time.

It is another general object of the present invention to provide a clock generation system having a plurality of clock controlled circuits, one of which is selectable to operate as the master clock control.

It is another general object of the present invention to provide a clock generation system which permits removal and replacement of unit cards while the remainder of the processing system is maintained in a run mode.

It is another general object of the present invention to provide a novel clock generation system that synchronizes high speed clock pulses between chips, unit cards and cabinets or CPU's.

It is another general object of the present invention to provide an on-chip clock generator which enables built-in self tests (BIST) testing of VLSI circuits on unit cards by phase control of individual clock generators using on-chip polynomial generators.

It is another general object of the present invention to provide an on-chip clock generator which may be started in phase synchronization after testing and/or after a unit card is replaced while the processor system is still running on-line.

According to these and other objects of the present invention, there is provided a novel clock system for a mainframe processor having individual on-chip clock generators comprising on-chip phase generators and on-chip buffer drivers which minimize the on-chip generator skew. Further, there is provided on-chip start, stop and run control means coupled to the buffered drivers for generating desired sequence of phases under control of a master clock system which is off-chip.

DESCRIPTION OF THE PREFERRED EMBODIMENT

Figure 1:
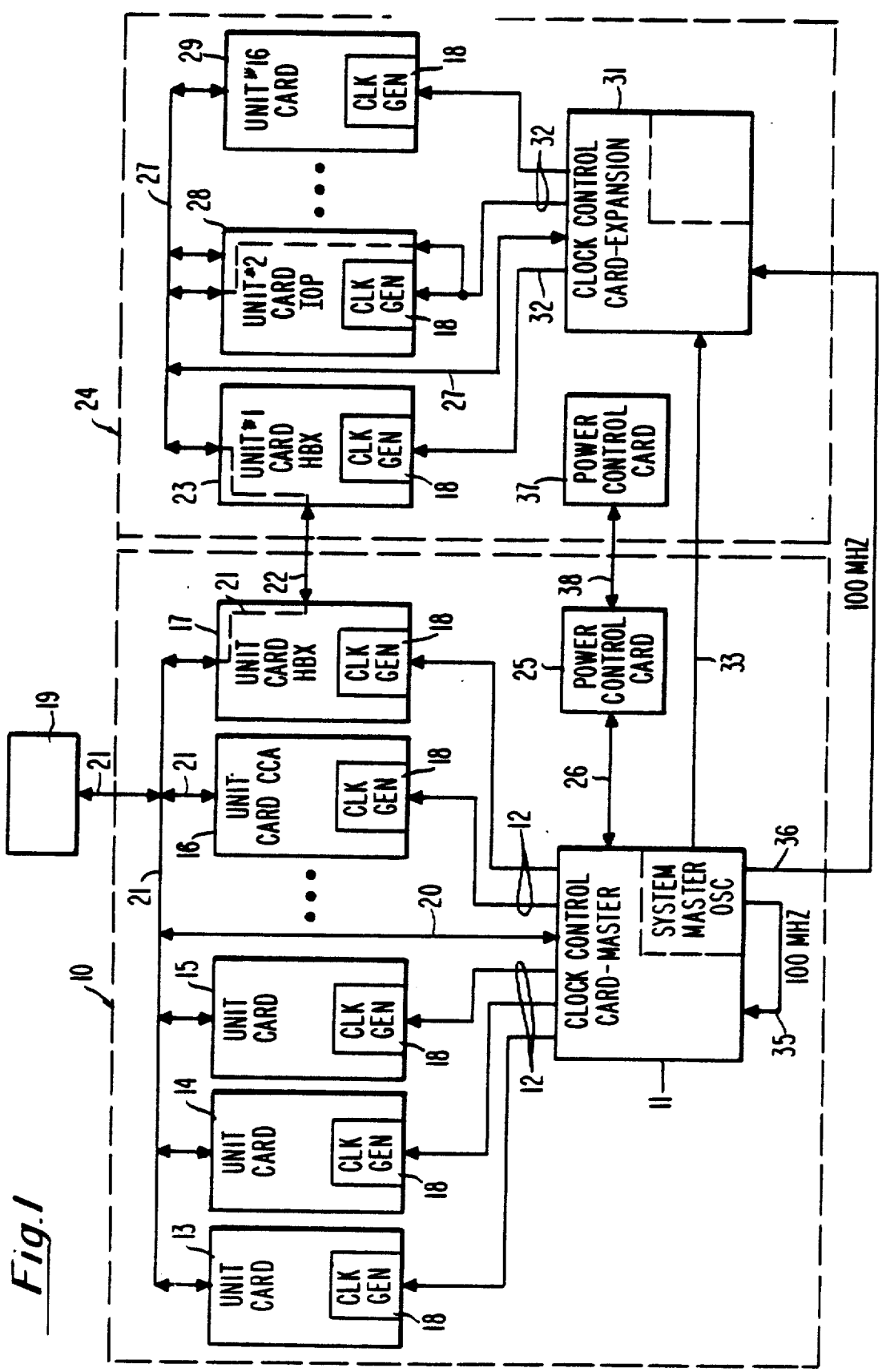
FIG. 1 is a clock system block diagram showing a processor cabinet and an expansion cabinet containing unit cards each of which have a plurality of logic chips that have at least one on-chip clock generator.

Refer now to FIG. 1 showing a clock system block diagram depicting a two mainframe cabinet system in which each cabinet has its own clock control unit card. Processor cabinet 10 comprises a master clock control card 11 which supplies clock control signals on lines 12 to logic unit cards 13 to 17. Each unit card contains a plurality of VLSI chips each of which is provided with a novel on-chip clock generator 18 to be discussed in detail hereinafter. Maintenance controller 19 is connected by a scan set bus 21 to the unit cards 13 to 17. Bus 21 extends through unit card 17 and connects by cable 22 to the main bus expander card 23 in the expansion cabinet 24. When the main processing system is first powered up, the maintenance controller 19 is employed to start up the system. Power control card 25 in processor cabinet 10 is employed to synchronize the clock systems in both of the cabinets 10 and 24. A power on clear signal is generated on line 26 and is employed to clear the clock control card 11. The power on clear signal is then distributed on bus 20 to the scan set bus 21 and to each of the unit cards 13 through 17 and by connector cable 22 to unit card 23. Scan set bus 27 connects to the unit cards 23, 28 and 29. Bus 27 also connects to the expansion clock control card 31 which is identical to the master clock control card 11 but operates as a slave to the master 11. Control card 31 generates clock control signals on lines 32 which are applied to the on-chip clock generators 18 in control cards 23, 28 and 29. When the power on clear signal generated on line 26 goes inactive, the clock system unit cards 11, 31 shown in FIG. 1 are synchronized. At this point in time, no clock phase signals are being generated on the on-chip clock generators 18. The maintenance controller 19 is then employed to start the systems and the clock generators in the proper pre-determined phases. The maintenance controller 19 loads start patterns in the clock control cards 11 and 31. After the start patterns are loaded, the master control card 11 will activate an expansion clock run signal on line 33 to cause both clock control cards 11 and 31 to simultaneously generate run signals on lines 12 and 32 to the on-chip clock generators 18, thus, completing the phase synchronization of the system. The master oscillator 34 in clock control card 11 distributes the basic clock signal through equal length cables 35 and 36 which connect to the clock controls 11 and 31 to provide the basic reference timing signals to the system. In the preferred embodiment system, unit cards 13 to 15 include the memory and logic of the main processor and have expansion slots. Unit card 16 is the channel to channel adaptor unit card. Unit cards 17 and 23 are the cabinet to cabinet adaptor unit cards. Unit card 28 and expansion slots up to unit card 29 are for adaptor cards for channels and peripheral units.

In a one cabinet one processor system, the I/O processor cards may be placed in the processor cabinet 10. At some future date, an expansion cabinet 24 may be added. The expansion cabinet 24 includes an adaptor card, the I/O processor cards and is further provided with the expansion clock control card 31 and the power control card 37 which is connected via cable 38 to the master power control card 25.

Figure 2:
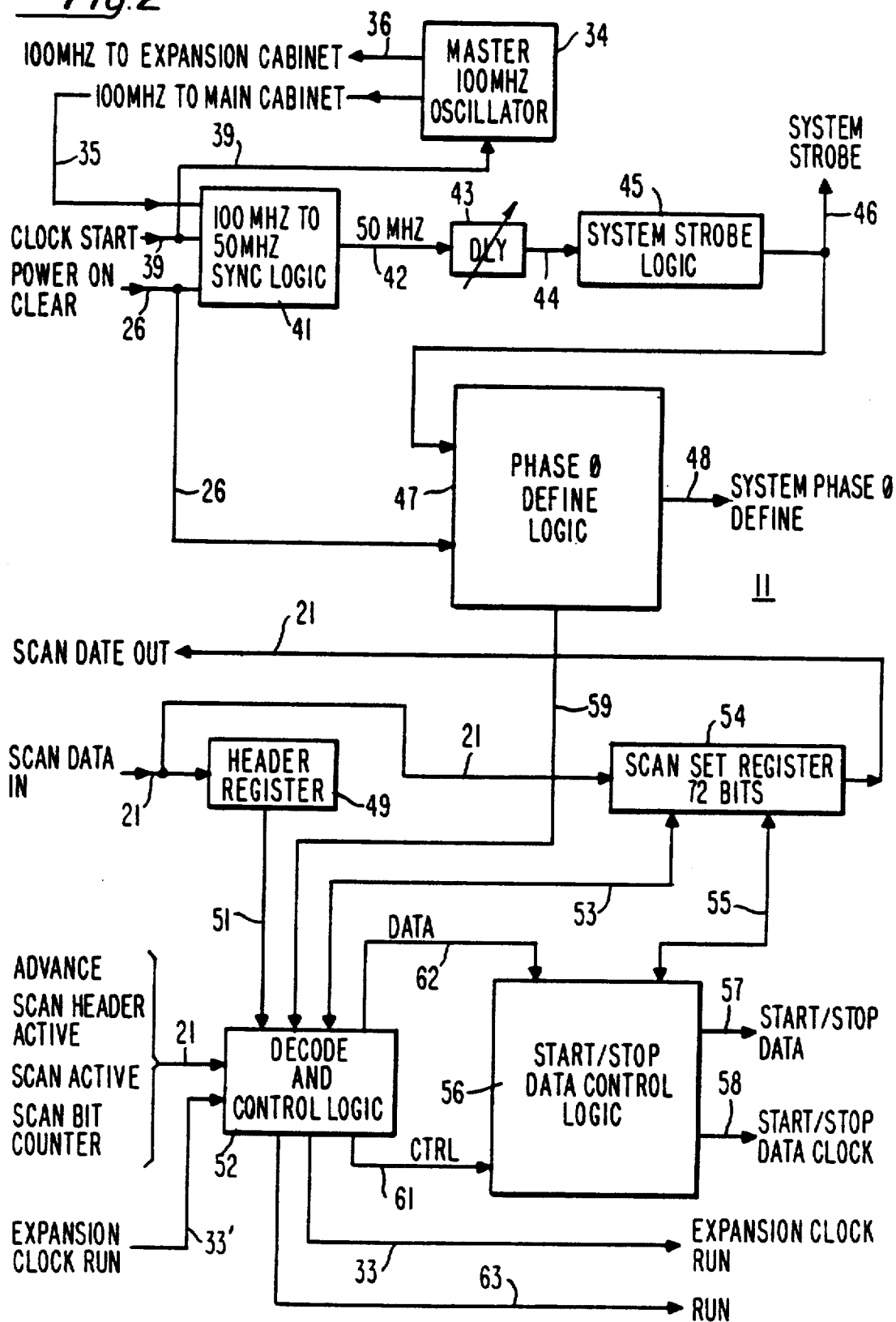
FIG. 2 is a more detailed block diagram of a master clock control circuit on a unit card which contains the off-chip clock control logic.

Refer now to FIG. 2 showing a more detailed block diagram of the master clock control card 11 circuitry. The aforementioned master oscillator 34 generates a 100 megahertz signal on lines 35 and 36 to their main cabinet and expansion cabinets respectively as shown in FIG. 1. Cable 35 is coupled to its own sync logic 41. A clock start input signal on line 39 is applied as a second input and the third input is the aforementioned power on clear signal produced on line 26. Sync logic 41 converts the 100 megahertz to a 50 megahertz signal on output line 42 which is applied to an adjustable delay 43 to produce an adjusted 50 megahertz signal on line 44 which is applied to system strobe logic 45. System strobe logic 45 produces the system strobe signal on output line 46 which is applied to generator 18 and also applied as an input to the phase 0 define logic 47. The phase 0 define logic produces a system phase 0 define signal on line 48 which is applied to generators 18. The systems strobe signal on line 46 and the phase 0 define signal on line 48 are the two tightly controlled input signals fed to each of the on-chip clock generators 18.

The maintenance controller 19 (not shown) generates the aforementioned scan data signals on bus 21 which are applied to the header register 49 on the master clock control card 11. The header register is employed to identify the address of the unit card to which the information on bus 21 is addressed. Assuming that the address of the control card 11 is placed in header register 49, then the address output signal on line 51 is applied to the decode and control logic 52 to be compared with the unit card address to generate an enable signal on line 53 to the scan set register 54 which when enabled accepts the scan data on bus 21 into the seventy-two bit register 54. In the preferred embodiment of the present invention, the first sixteen bits loaded into register 54 are presented on line 55 to the start-stop data control logic 56 which transmits start-stop data on line 57 to all of the clock generators 18. The sixteen bits on line 55 cause the data control logic 56 to generate a stream of sixteen data clock pulses on line 58 at one fourth the system clock rate. The synchronizing clock signals are provided by phase defined logic 47 on line 59 which are applied as an input to control logic 52. Control logic 52 in turn produces control signals on line 61 to data control logic 56. Control logic 52 is provided with a plurality of control signals via lines 21 which produce the data signals on line 62 to the data control logic 56. The advance control signal controls the BIST mode of operation and the latter three control scan signals, control the loading of the header register 49 and the scan set register 54. Control logic 52 produces an expansion clock run signal on line 33 (shown also in FIG. 1) and a run signal on line 63 which is also provided at each of the clock generators 18. If the clock control card 11 shown in FIG. 2 is a slave to the clock control card 31, an expansion clock run signal is provided on line 33' to control logic 52 on card 31. however, if card 11 is the master, there is no signal on line 33'.

Figure 3:
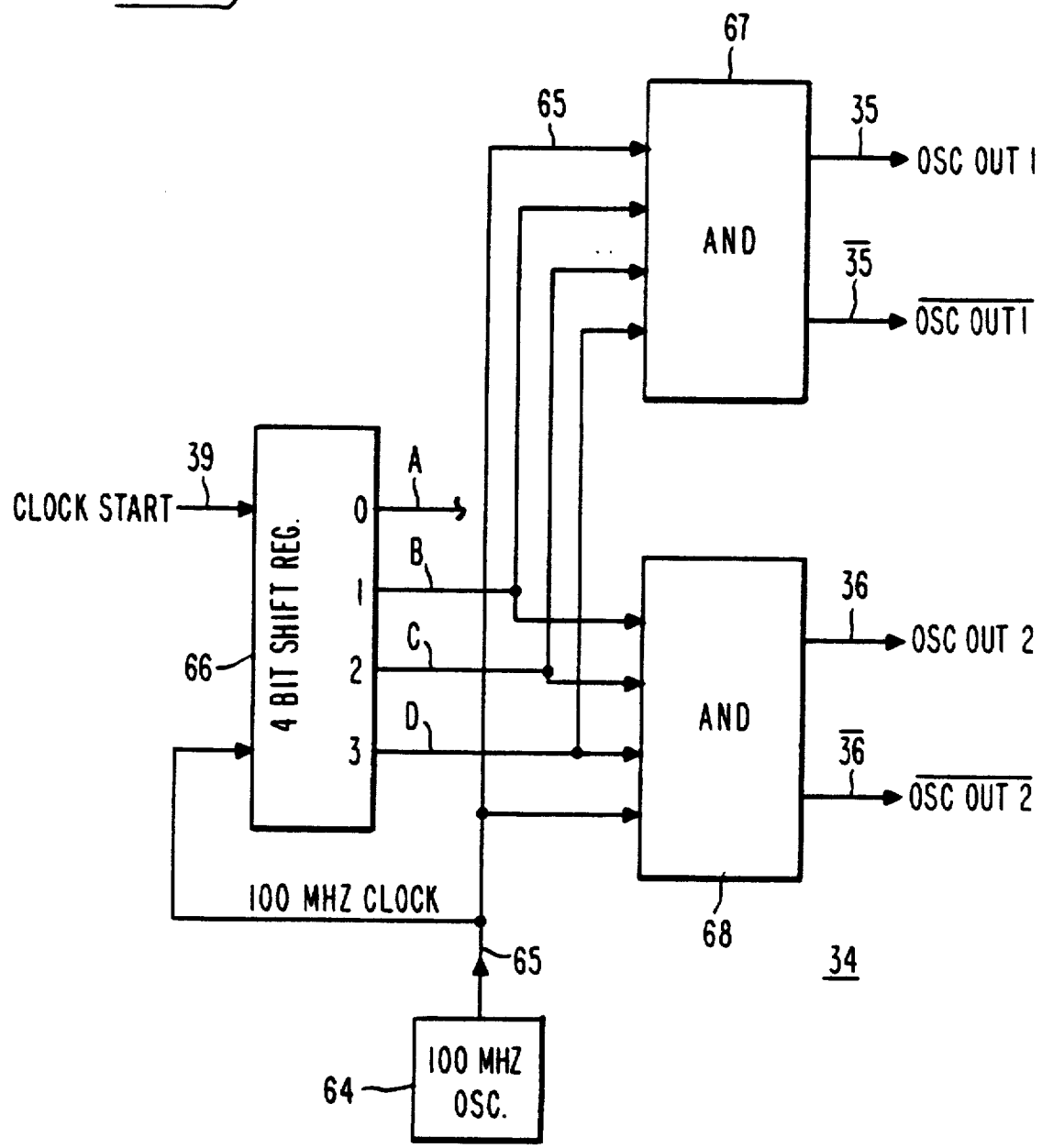
FIG. 3 is a more detailed block diagram of the off-chip master oscillator circuit portion of the master clock control circuit of FIG. 2.

Refer now to FIG. 3 showing a more detailed block diagram of the master oscillator circuit 34. A 100 megahertz crystal oscillator 64 provides a stable 100 megahertz signal on line 65 as the base clock signal which is applied to a four bit shift register 66 and two AND gates 67 and 68. The clock start signal on line 39 is normally low on power up. When the clock start signal on line 39 goes high it is held for a predetermined time to stabilize the clock system. When the clock start signal on line 39 again goes low and the output signals on lines B, C and D become low active simultaneously, then the oscillator signal on line 65 is gated out through AND gates 67 and 68 onto lines 35 and 36 (shown also in FIG. 1) and the clock system becomes synchronized as will be explained hereinafter.

Figure 4:
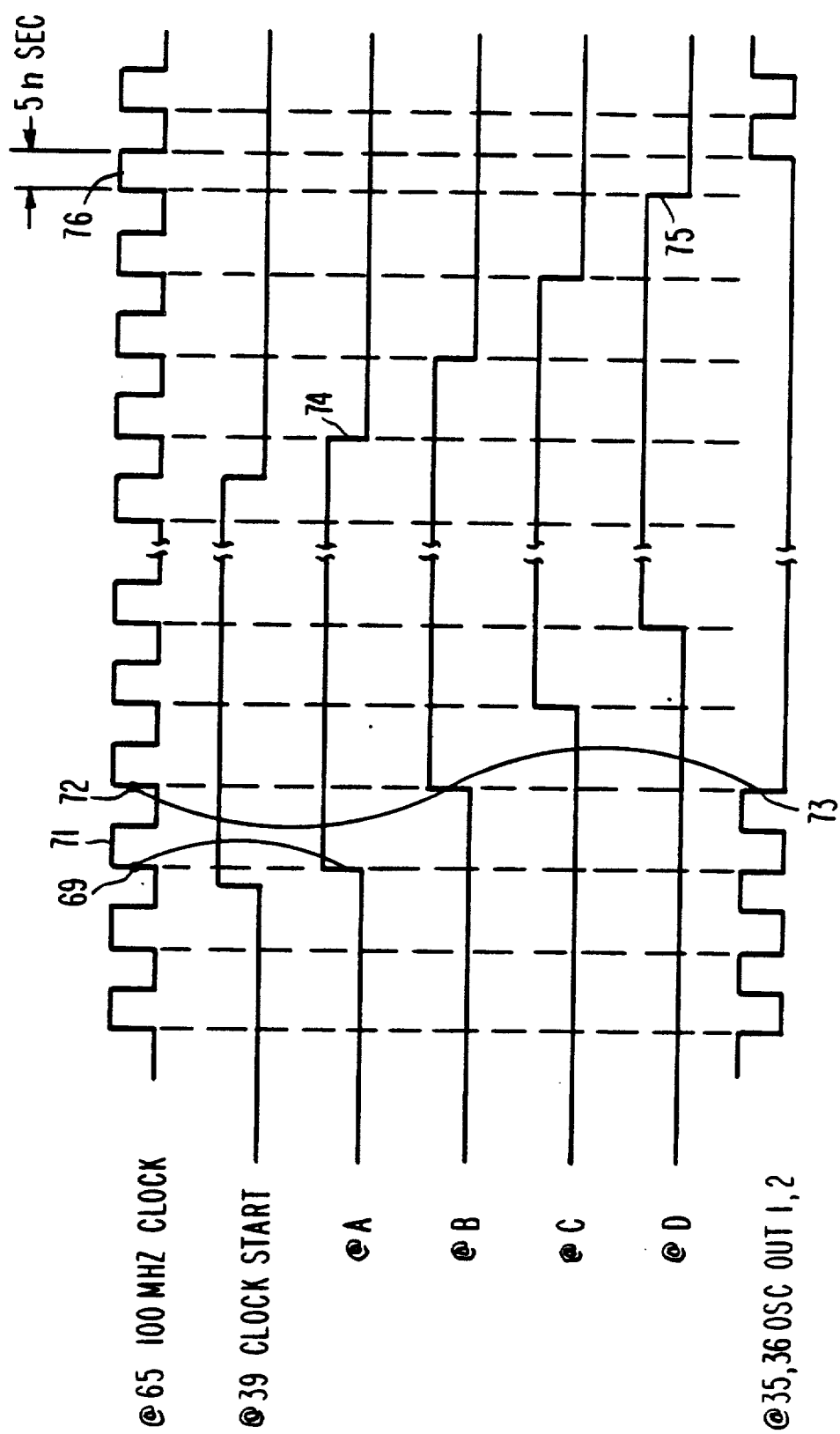
FIG. 4 is a timing diagram showing wave forms associated with the master oscillator circuit of FIG. 3.

Refer now to FIG. 4 showing a timing diagram for the master oscillator circuit of FIG. 3. The 100 megahertz clock signal on line 65 is shown having a pulse time of 5 nanoseconds or a cycle time of 10 nanoseconds. The clock start signal on line 39 is normally low and when the signal goes high prior to the leading edge 69 of clock pulse 71 it causes the 0 output on line A from shift register 66 to go high. In a similar manner, at the next following clock cycle time, the 1's output on line B from shift register 66 goes high at point 72. When line B goes high as an input to AND gates 67 and 68, the outputs from these AND gates on lines 35 and 36 are disabled and go low as shown at point 73. At the next following clock cycles, the outputs on lines C and D go high. When the clock start signal on line 39 goes low the output on line A goes low at the next following clock time shown at point 74. At each sequential clock cycle time, lines B, C and D go low. Line D goes low at point 75 when the leading edge of pulse 76 goes high and stays high during the next 5 nanoseconds transition time. AND gates 67 and 68 are enabled by the simultaneous presence of B, C and D in the low state. This condition permits the oscillator output signals on lines 35 and 36 at the next low clock pulse after pulse 76 on line 65 goes low creating a pulse train on lines 35 and 36 that are 180 degrees out of phase with the clock on line 65. The inverted outputs from AND gates 67 and 68 on lines 35, 36 are in phase with the 100 megahertz clock on line 65. Having explained the operation of the preferred embodiment master oscillator circuit, it will be understood that the clock start signals on line 39 and not synchronous with the oscillator signals on line 65. Shift register 66 is employed to synchronize the four stages of shift register outputs and eliminate metastability in the shift register 66.

Figure 5:
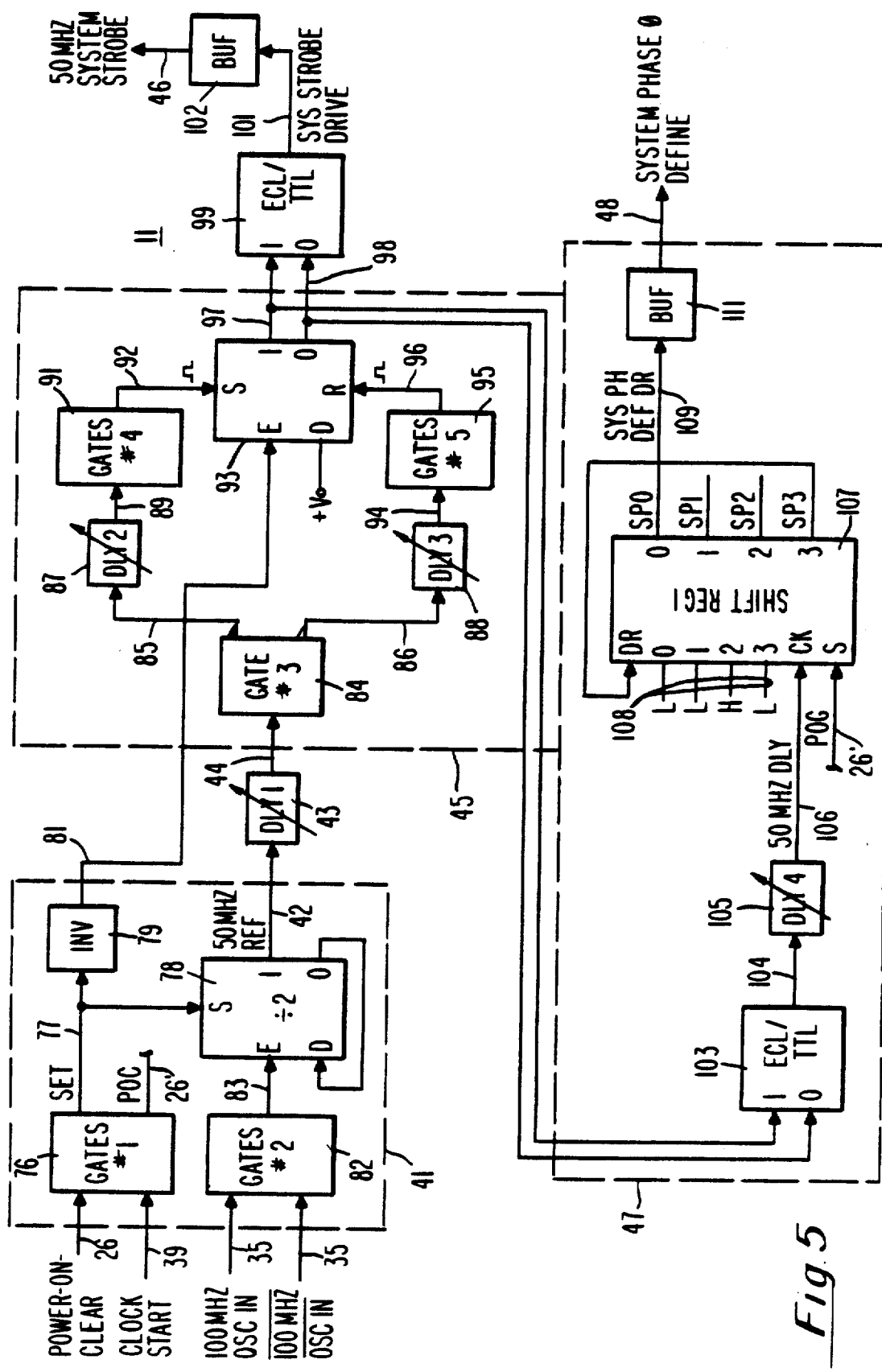
FIG. 5 is a more detailed block diagram of the master clock control circuits of FIG. 2 which generate the system strobe and system phase 0 signals supplied to each of the on-chip clock generators.

Refer now to FIG. 5 showing a more detailed block diagram of the master clock control circuit 11 shown in FIG. 2. The aforementioned sync logic 41 is shown having a power on clear signal on line 26 and a clock start signal on line 39 applied as inputs to gate logic 76 to produce a buffered power on clear signal on line 26' and a SET signal on line 77. The SET signal is applied to the SET input side of a divide by two circuit 78 and to inverter 79 to produce an enable signal on line 81. The 100 megahertz signals on lines 35, 35, 36 (shown in FIG. 3) are applied as inputs to gate logic 82 to produce an enable signal on line 83 which is applied as a clock enable input to the divide by two circuit 78 which produces the aforementioned 50 megahertz reference signal on line 42 shown applied to adjustable delay 43. The adjusted 50 megahertz reference signal on line 44 is applied to gate logic 84 of the system strobe logic 45. A high and low output from gate logic 84 on lines 85 and 86 are applied to a symmetrical pair of adjustable delays 87 and 88. The output of adjustable delay 87 on line 89 is applied to gate logic 91 to produce a narrow SET pulse on line 92 which is applied to the SET input of set clear flip-flop 93. Similarly the output of adjustable delay 88 on line 94 is applied to gate 95 to produce a narrow RESET pulse on line 96 which is applied to the RESET input of flip-flop 93. The data input of flip-flop 93 is preferably applied to a high reference shown as +V. The narrow pulses presented on lines 92 and 96 are 180 decrees out of phase and may be critically adjusted by delays 87 and 88 to produce a perfectly symmetrical system strobe pulse on output line 46. The high and low outputs from flip-flop 93 on lines 97 and 98 are applied to an ECL/TTL level converter 99 to produce a system strobe output signal on line 101 which is applied to a buffered driver 102 to produce the aforementioned systems strobe signal on line 46 which is employed in the on-chip clock generators to be explained hereinafter.

The high and low signals from flip-flop 93 on lines 97 and 98 are applied to a second ECL/TTL level converter 103 to produce a system strobe signal on line 104 which is applied to an adjustable delay 105 in the phase 0 define logic 47. The output of adjustable delay 105 provides a delayed version of the 50 megahertz system strobe signal that appears on lines 101 and 104. The delayed signal on line 106 is applied as the clock input to four bit shift register 107 which is further provided with the aforementioned power on clear signal on line 26' from gate logic 76. A pattern of low and high inputs on lines 108 are set into register 107 when the power on clear signal on line 26' is high active. The shift register 107 does not produce system phase signals on its output lines 0 to 3 until the power on clear signal goes low inactive. The system phase 0 signal on line 109 appears as a 20 nanosecond signal every 80 nanoseconds at the input of buffered driver 111. The output of buffer driver 111 provides as a fan out signal on aforementioned line 48 as the the system phase 0 define signal employed at each of the on-chip clock generators 18. The purpose of the adjustable delay 105 is to factory adjust the pulse on line 48 symmetrical to the rising edge of the 20 nanosecond critical pulse on line 46. As long as the rising or leading edge of the critical 20 nanosecond pulse on line 46 stays in the pulse window of the pulse on line 48 the operation of the on-chip clock generator will perform in a normal mode of operation. The inputs at lines 26, 35 and 39 to sync logic 41 are the inputs to the card 11. The system strobe signal output on line 46 is the output of card 11 to the on-chip clock generators. To adjust the fixed delay on each unit card 11 it is only necessary to adjust delay 43 at the factory so that cards have the same delay from input to output and are thus interchangeable without custom adjustment in the field.

During the time when the clock start signal on line 39 is high and cuts off the oscillator output signals, as explained with reference to FIGS. 3 and 4, the flip-flop 78 is jammed to the set state by the signal on line 77. A similar operation is taking place in the clock control card 31 in the expansion cabinet 24. Thus, when the power control card 25 drops the power on clear signal and the clock start signal on lines 26 and 39, the oscillator output signals on lines 35 and 36 restart in synchronization at both clock control cards 11 and 31. Stated differently, two cabinet synchronization or two processor synchronization occurs simultaneously at both units.

Figure 6:
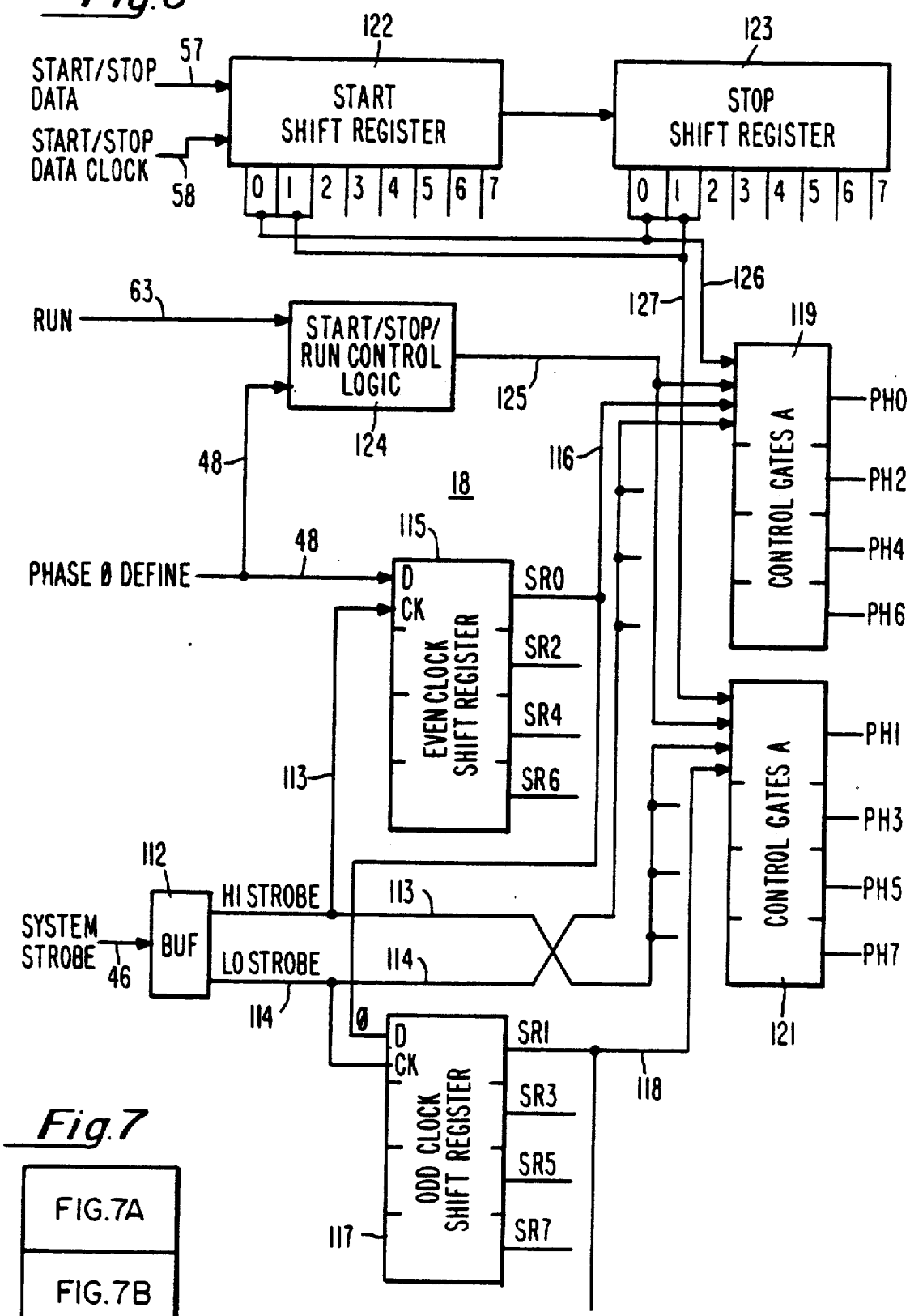
FIG. 6 is a detailed block diagram of the novel clock generators which are replicated at least once on each of the logic chips.

Refer now to FIG. 6 showing a detailed block diagram of the novel on-chip clock generators 18 which are replicated at least once on each VLSI logic chip. Each of the aforementioned logic unit cards shown in FIG. 1 are provided with a plurality of such logic chips 18 and these chips are also fully synchronized with each other as well as being synchronized between unit cards and cabinets or processors as will be explained. The output signals on lines 46 and 48 shown in FIG. 5 are shown as input signals on lines 46 and 48 at pins or terminals on the chips which contain the clock generator logic 18. It will be understood that the portion of the chip on which the clock generator 18 is provided is a very small portion of the logic chip and preferably employs as few pins as necessary to accomplish its logical function. Further, the unit cards which contain the logic chips on which the clock generators 18 are provided are designed so that the phase 0 define signal on line 48 and the more critical system strobe signal on line 46 are arriving at all clock generators 18 on the plurality of VLSI logic chips simultaneously with skew and other forms of distortion removed. The critical strobe signal on line 46 is applied to an on-chip input buffered driver 112 which generates high strobe and low strobe output signals on lines 113 and 114 respectively. The high strobe signal on line 113 is applied to the even clock shift register 115. The pulses occurring every 20 nanoseconds on line 113 are clocked in on the arrival of the first 20 nanosecond pulse occurring on line 48 every 80 nanoseconds. The shift register 0 (SR0) pulse on output line 116 is applied as an input to the odd clock shift register 117. This signal on line 116 remains high for 20 nanoseconds and occurs every 80 nanosecond machine cycle. The rising edge of the low strobe signal on line 114 occurs during the latter part of the high condition of the shift register 0 (SR0) pulse which generates a high output SR1 signal on line 118 that is separated in time by 10 nanoseconds from the signal on line 116. The flip-flops in shift registers 115 and 117 are sequentially generating outputs at their output lines represented by lines SR2 to SR7, occurring 10 nanoseconds after the input signals on lines 113 and 114. Thus, the SR0 signal on line 116 is delayed 10 nanoseconds and will occur as a high signal at the phase 0 AND gate 119 when the low strobe signal on line 114 goes high. A similar condition occurs at phase 1 AND gate 121 when the last 10 nanoseconds of the 20 nanosecond pulse on line 118 goes high at the same time the high strobe signal on line 113 is high.

As explained hereinbefore, shift registers 115 and 117, which comprise a plurality of flip-flops, produce 20 nanosecond pulses which are not well defined and may have overlap our separation. These output signals are redefined by the very tightly controlled system strobe signals on line 46 which are occurring on lines 113 and 114. Thus, the output of gates 119 and 121 are redefined by the tightly controlled system strobe signals on line 46. The other inputs to the control gates 119, 121 are employed to start, run and stop the control gates in a manner which permits the start and stop at any pre-determined phase set in the start shift register 122 and stop shift register 123. A pre-determined run time is selected by the run line signal on line 63 The data for setting the start and stop shift registers 122, 123 is supplied from off-chip at data line 57 as explained hereinbefore. This data comprises 16 bits of information which will load both the start and stop shift registers 122 and 123 and enable the start of the on-chip clock generator 18 at any one of a desired eight phases and permit running as long as run line 63 is active. Generator 18 will stop the sequence of phase generation operations at the phase defined in stop shift register 123 when run line 63 goes inactive.

Run control logic 124 is clocked or synchronized by phase zero define pulses on line 48 and provides clocked and synchronized output signals on individual lines 125. Each of the phase 0 to phase 7 control gates 119,121 etc. has an individual 125 line input The phase control gates are staged AND/OR gates having a final flip-flop or single stage shift register output as will be explained in greater detail hereinafter. In similar manner each phase control gate 119, 121 etc. has an individual input line 126 and 127 from the stop and start shift registers 123, 122. The necessary inputs shown to control gates 119, 121 etc. will only occur at one unique phase control gate during any one strobe cycle of ten nanoseconds. Cycling through eight phases requires eighty nanoseconds. If only four phases of the clock are to be employed, the odd or the even phase control gates are connected to provide the four phase clock signals having a duration of twenty nanoseconds.

For test purposes it is possible to generate a single phase and stop or generate one or more cycles and stop, starting on any -phase and ending on any other phase. Normally the patterns set in the shift registers 122 and 123 are being provided from the maintenance controller 19 as mentioned hereinbefore. When it is desired to go into the built-in self-test (BIST) mode of operation, the data pulses on line 57 are provided by control logic 52 shown in FIG. 2 on every activation of the advance signal applied on line 21. In the preferred (BIST) mode operation the advance signal is adapted to advance the clock generator 18 through nine phases of operation on each advance pulse. For example, the first advance pulse will go from phase 0 to phase 0 which includes nine phases. The second advance pulse will go from phase one to phase one which also includes nine phases and for each sequential advance pulse the clock generator will sequence through a burst of nine phases As is well known in the testing art, it is possible to examine the condition of the latches on each of the VSLI chips between advance pulses by cycling flip-flops connected in a series close loop chain through a polynomial generator. Scan-set configurations for self testing are provided in the logic of better designed mainframe computers.

For purposes of simplification the inputs only to phase control output gates 119 and 121 have been shown but it will be understood that the gates for phase 2 through phase 7 operate in the same manner as explained hereinbefore.

Figure 7:
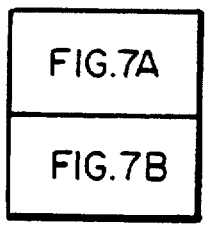
FIGS. 7A and 7B, connected as shown in FIG. 7, are a detailed block diagram showing the output buffer drivers at the final stage of the on-chip clock generators.
Figure 7A:
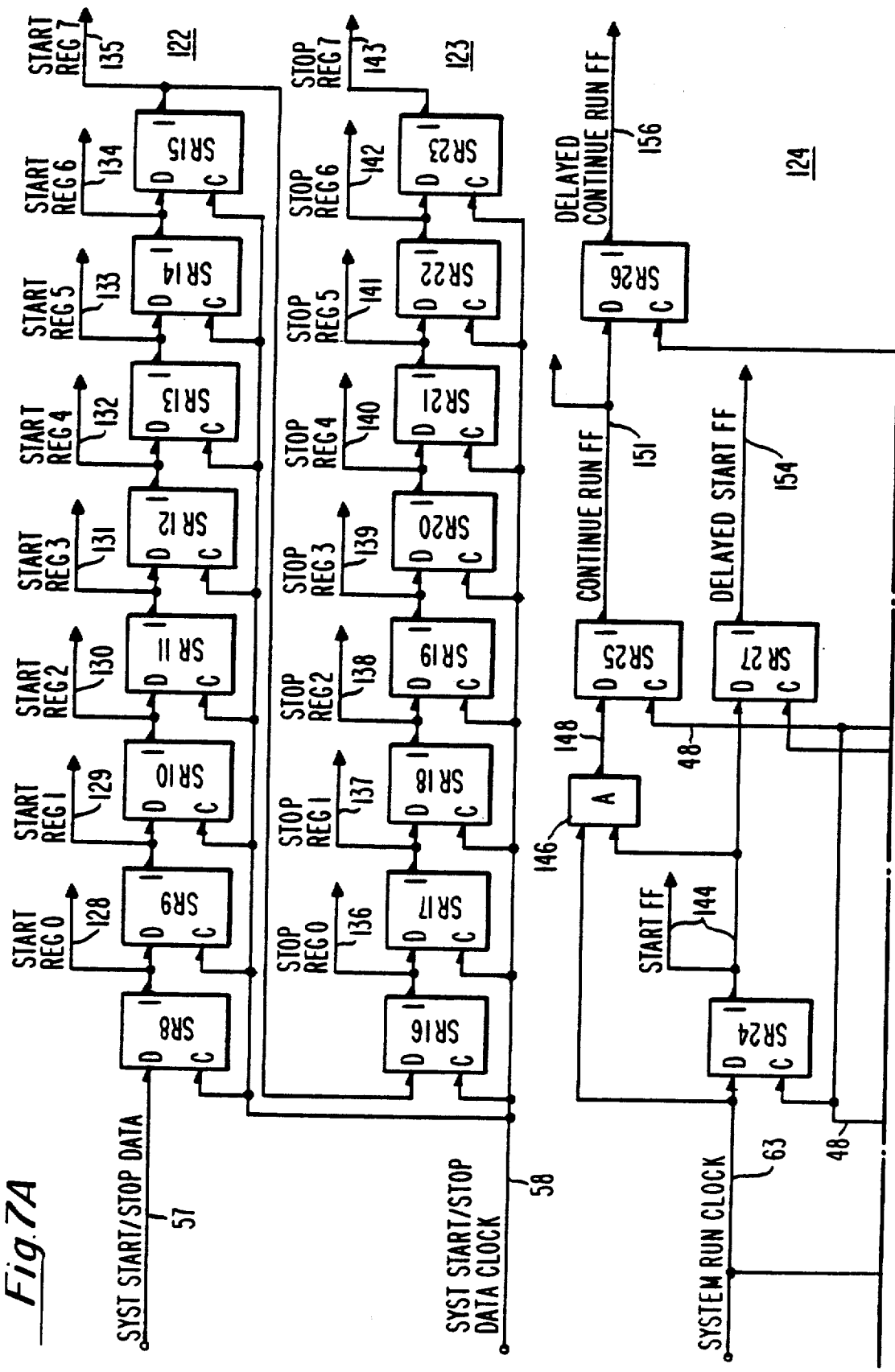
Figure 7B:
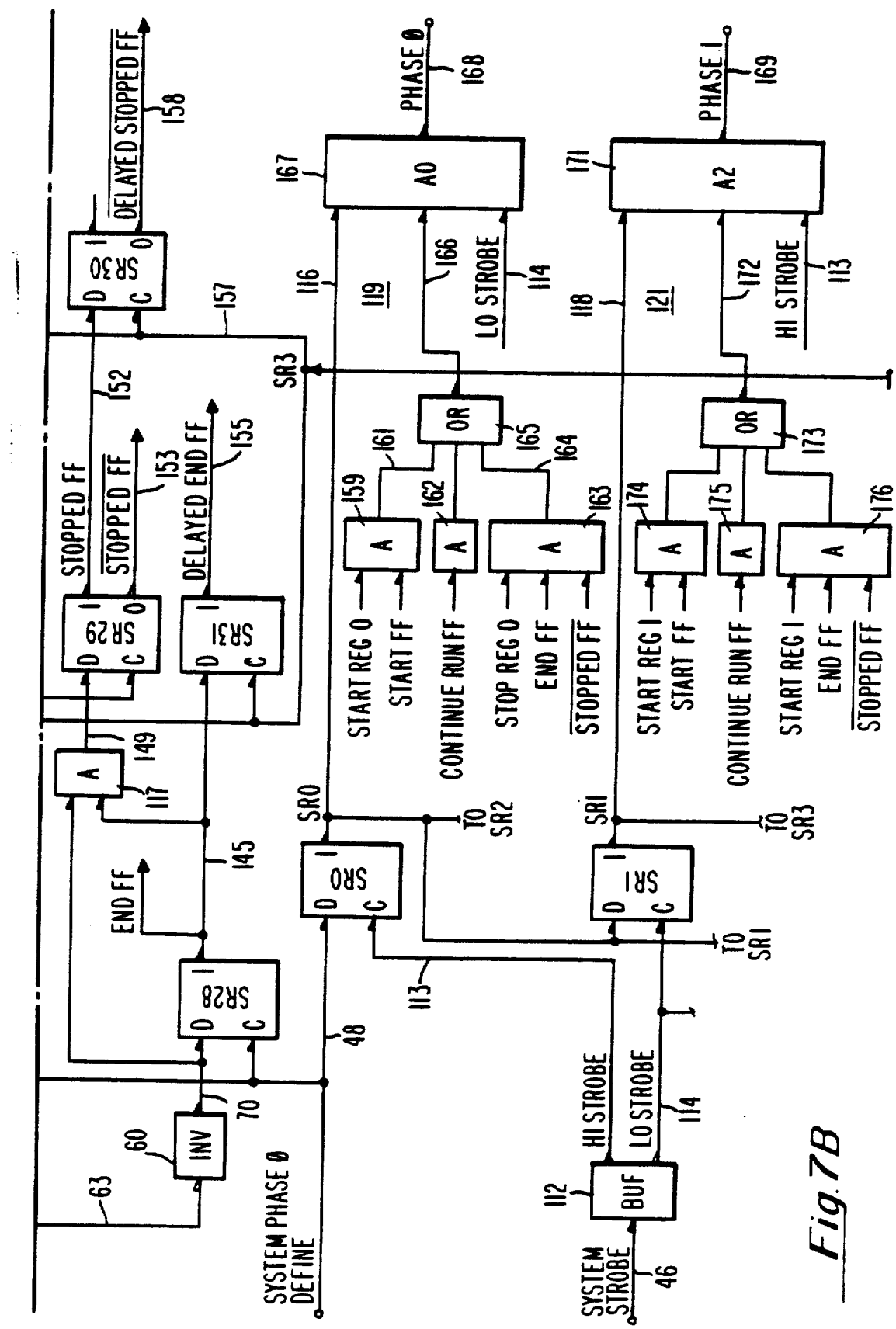

Refer now to FIG. 7 showing a detailed logic block diagram of the gates and buffered drivers at the final stages of the on-chip clock generators 18. The aforementioned off-chip system start-stop data signal on line 57 is applied to the on-chip data input of 16 shift registers numbered SR8 through SR23 of registers 122, 123 of FIG. 6. The off-chip system start-stop data clock signal on line 58 is applied to the clock input of the same shift registers to produce a shifting action of the start-stop data pulses on line 57. The outputs of shift registers SR8 through SR15 provide the start register 0 through start register 7 output signals on lines 128 through 135. Similarly the output from shift register stages SR16 through SR23 on lines 136 through 143 provide the stop register 0 through stop register 7 output signals which are applied to the input of the phase control gates 119, 121 etc. of the phase 0, phase 1 etc. output gating means.

The off-chip system clock run signal on line 63 and the off-chip system phase 0 define signal on line 48 are applied to shift registers SR24 and SR28 to provide the start flip-flop and end flip-flop signals on lines 144 and 145. The signal on line 63 is inverted at inverter 60 to provide an inverted clock signal on line 70 The clock signals on lines 63 and 70 are applied to AND gates 146 and 147 along with the start and end signals on lines 144 and 145 to produce gated output signals on lines 148 and 149 which are applied to shift registers 25 and 29. The system phase 0 define signals on line 48 is also applied to shift registers 25 and 29 to produce the continue run flip-flop signals on line 151 and the stopped flip-flop signals on line 152 plus not stopped flip-flop signal on line 153. The start flip-flop signal on line 144 and the end flip-flop signal on line 145 are applied to shift registers 27 and 31 respectively along with a shift register 3 (SR3) output signal to produce the delayed start flip-flop signal on line 154 and the delayed END flip-flop signal on line 155. The signal on line 151 and the SR3 signal is applied to shift register 26 to produce a delayed continued run flip-flop signal on line 156. The stop flip-flop signal on line 152 and the SR3 signal on line 157 is applied to shift register 30 to produce the not delayed stop flip-flop signal on line 158. It will be understood that the signals produced from shift registers 25 through 31 are the control signals which are appearing on line 125 from the output of the run control logic 124.

A typical example of how the run control signals on line 125 are applied to the control gates 119, 121 etc. is as follows: Start AND gate 159 is shown having a start register 0 and a start flip-flop input signal to produce a signal on line 161 which controls the start shift register's starting of the clock phases. Continue to run AND gate 162 provide means for generation of the clock phases on the second and subsequent clock cycle. Stop AND gate 163 controls the phases generated by the stop register for one cycle and produces an output signal on line 164 which is applied to OR gate 165. The output of OR gate 165 on line 166 is applied as one of the three shown inputs to AND gate 167 to produce the desired phase 0 output on line 168.

The phase 1 output on line 169 is generated by AND gate 171 shown having three inputs, two of which were shown to be generated on FIG. 6 on lines 113 and 118. The third input on line 172 is produced at the output of OR gate 173 which has inputs from the start, run and stop AND gates 174, 175 and 176 respectively these AND gates have inputs generated at the start and stop shift registers 122 and 123 and the run control logic 124. The signal on line 116 from shift register 0 is produced by the aforementioned system phase 0 define signal on line 48 and the strobe high signal on line 113 produced at the output of input buffer 112. The signal on line 118 is shown as the SRI output from shift register 1. Shift register 1 has an input signal from shift register 0 and a low strobe input signal from the input buffer 112.

Having explained the preferred embodiment operation of output gate 119 which produces phase 0 signals and output gate 121 which produces the phase 1 signals it will be understood that the phase 2 through phase 7 signals are produced in similar manner and do not require a detailed explanation herein All of the necessary control signals produced at run control logic 124 are shown and the cascading of the signals from shift registers SR2 through SR7 are implied in the explanation accompanying FIG. 6 knowing that each of the gates producing phase 2 through phase 7 signals have inputs from lines 113 or 114 occurring simultaneously with signals produced at lines SR2 through SR7 shown in FIG. 6.

Having explained a preferred embodiment of the present invention on-chip clock generators 18 and how the signals from the master clock system on the clock control cards 11, 31 provide off-chip control of the on-chip clock generator 18 it will be understood that the output of phase control gates 119, 121 etc. at the output of the clock generator 18 are produced on every logic chip on the unit cards within a very closely defined time period without skew of the type produced employing off-chip clock generators. The only skew which occurs in the present embodiment invention occurs after the output from gates 119 and 121 etc. which is precalculated to be within defined tolerances that will assure proper high speed operation.

The first time that clock signals, identified as clock phase signals PH0 to PH7, are produced on the very large scale integrated (VLSI) circuit chips are at the final stage of the clock generator, thus, assuring that every logic chip is receiving phase signals at the same time regardless of where the unit cards are placed in the system. Further, it is a feature of the present invention that any unit card may be shut down while the rest of the system is running to perform maintenance on a unit card or a logic chip on a unit card while the remainder of the processing system is maintained in a run condition. It is possible to provide control logic in control logic 52 of FIG. 2 which will phase or cycle step logic chip circuits on unit cards that are having maintenance performed while the rest of the system is maintained in a run condition. Further, after performing maintenance operations on a logic chip or a unit card it is possible to restart the unit card, or replacement unit card, and all logic chips on the unit card in the proper synchronized desired pre-determined phase while the remainder of the system continues to run.

What is claimed is:

1. An on-chip phase generator for a computer having off-chip signals, comprising:
    on-chip phase generator means having a plurality of output gates,
    start-stop run control means coupled to said phase generator means and said off-chip control signals,
    start register means,
    stop register means,
    said start and said stop register means each having a plural outputs being coupled to individual ones of said output gates of said phase generator means for starting and stopping at predetermined phases of said phase generator,
    said start and stop register means having inputs coupled to said off-chip control signals for setting predetermined phase start and stop data therein, and phase defining means coupled to said output gates of said phase generator means, said phase defining means having inputs coupled to said off-chip control signals for generating phase defining timing signals.

2. An on-chip phase generator as set forth in claim 1 wherein said start register means comprises a serial shift register coupled to an input of said off-chip control signals.

3. An on-chip phase generator as set forth in claim 2 wherein said stop register means comprises a serial shift register coupled to said start shift register.

4. An on-chip phase generator as set forth in claim 3 wherein said start-stop run control logic means comprises a plurality of start and stop shift registers connected in parallel.

5. An on-chip phase generator as set forth in claim 4 wherein said plurality of start and stop shift registers comprise a plurality of stages of single element shift registers.

6. An on-chip phase generator as set forth in claim 1 wherein said off-chip control signals coupled to said start-stop run control logic means comprise a system run or system NOT run clock signal.

7. An on-chip clock generator as set forth in claim 6 wherein the presence of a system run clock signal is effective for starting said start register means at said predetermined phase set therein.

8. An on-chip phase generator as set forth in claim 7 wherein the absence of a system run signal provides said system NOT run clock signal for stopping said stop shift register means at said predetermined phase set therein.

9. An on-chip phase generator as set forth in claim 1 wherein said off-chip control signals determine the number of machine cycles or fractions of machine cycles of said output gates of said phase generator.

10. An on-chip phase generator as set forth in claim 1 wherein said phase defining means coupled to said off-chip control signals generated at an off-chip clock card means, said off-chip clock card means being coupled to a main scan set bus for receiving start patterns for controlling said on-chip phase generator means.

11. An on-chip phase generator as set forth in claim 10 wherein said clock card means is located off-chip at a remote position from chips which contain said phase generator.

12. An on-chip phase generator as set forth in claim 11 wherein said clock card means comprises a plurality of separate clock cards one in each of separate cabinets of said computer, and wherein one clock card is a master clock card and all other clock cards are slave clock cards connected to said master clock card through cables having equal predetermined delays.

13. An on-chip phase generator as set forth in claim 12 wherein said separate clock cards in separate cabinets are synchronized by said master clock card to provide synchronized off-chip control signals to unit cards containing a plurality of logic chips each having its own on-chip clock generator.

14. An on-chip phase generator as set forth in claim 13 wherein said clock cards and said unit cards are pre-synchronized and may be replaced in said cabinets of said computer without field adjustment.

15. An on-chip phase generator as set forth in claim 10 wherein said off-chip clock card means comprises a master oscillator and means for generating said off-chip control signals.

16. An on-chip phase generator as set forth in claim 15 wherein said means for generating said off-chip control signals comprise adjustable delay means for synchronizing a predetermined total delay of said clock card means.

17. An on-chip phase generator as set forth in claim 15 wherein said delay means comprise an adjustable delay coupled in series at the output of said master oscillator.

18. An on-chip phase generator as set forth in claim 15 wherein said means for generating said off-chip control signals comprise system strobe logic means coupled to the output of said master oscillator for generating master system strobe clock signals, said system strobe logic means having at least one adjustable delay.

19. An on-chip phase generator as set forth in claim 18 wherein said means for generating said off-chip control signals comprises phase define logic means coupled to the output of said system strobe logic means, said phase define logic means having an adjustable delay.

* * * * *